(12) United States Patent
Andreev et al.

(10) Patent No.: US 8,095,845 B1
(45) Date of Patent: Jan. 10, 2012

(54) SYSTEM AND METHOD FOR ASSIGNING CODE BLOCKS TO CONSTITUENT DECODER UNITS IN A TURBO DECODING SYSTEM HAVING PARALLEL DECODING UNITS

(75) Inventors: Alexander E. Andreev, San Jose, CA (US); Sergey Y. Gribok, San Jose, CA (US); Vojislav Vukovic, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 853 days.

(21) Appl. No.: 12/169,703

(22) Filed: Jul. 9, 2008

(51) Int. Cl.
*H03M 13/00* (2006.01)
(52) U.S. Cl. .......................... 714/755; 714/774
(58) Field of Classification Search ................ 714/755, 714/774
See application file for complete search history.

(56) References Cited

U.S. PATENT DOCUMENTS

| | | | |
|---|---|---|---|
| 6,732,321 B2 * | 5/2004 | Classon et al. | 714/774 |
| 6,901,117 B1 * | 5/2005 | Classon et al. | 375/341 |
| 2007/0162818 A1 * | 7/2007 | Shen et al. | 714/755 |
| 2008/0154998 A1 * | 6/2008 | Ikeda | 708/210 |

* cited by examiner

*Primary Examiner* — M. Mujtaba Chaudry

(57) ABSTRACT

A system for, and method of, assigning code blocks to constituent decoding units in a turbo decoding system having parallel decoding units. In one embodiment, the system includes: (1) a resource model generator configured to generate a model that represents the constituent decoding units and memories thereof along two dimensions, (2) a decoding unit number calculator associated with the resource model generator and configured to determine, for each of the code blocks, a number of the constituent decoding units to use to decode subblocks of each of the code blocks, (3) a rectangle mapper associated with the decoding unit number calculator and configured to generate a mapping in which the code blocks are mapped to the model and (4) a code block assigner associated with the rectangle mapper and configured to assign the subblocks of each code block to the constituent decoding units in accordance with the mapping.

10 Claims, 8 Drawing Sheets

SYSTEM AND METHOD FOR ASSIGNING CODE BLOCKS TO CONSTITUENT DECODER UNITS IN A TURBO DECODING SYSTEM HAVING PARALLEL DECODING UNITS

TECHNICAL FIELD

The invention is directed, in general, to error correction coding (ECC) for digital communication and, more specifically, to a system and method for assigning code blocks to constituent decoding units in a turbo decoding system having parallel decoding units.

BACKGROUND

Digital communication systems have become vital for supporting modern, high-speed data communications. FIG. 1 is a block diagram of a typical digital communication system. A digital source 110 produces binary messages. A channel encoder 120 uses a forward error-correction coding (FCC) scheme to add some redundancy to the binary messages and transform every binary message into an encoded message called a code block. A modulator 130 transforms the code blocks into signals appropriate for transmission over a channel 140. The signals enter the channel 140 and are corrupted by noise 150. A demodulator 160 receives the signals from the channel 140 and converts it into blocks of symbols. A channel decoder 170 exploits the redundancy introduced by the channel encoder 120 to detect, and often correct, any errors added by the channel and to restore the original binary messages. A digital sink 180 makes use of the binary messages.

Data processing systems using convolutional codes for ECC are theoretically capable of reaching the Shannon limit, a theoretical limit of signal-to-noise for error-free communications. Before the discovery of turbo codes in 1993, Viterbi decoders were used to decode convolutional codes. However, as ECC requirements increased, the complexity of Viterbi decoders exponentially increased. Consequently, a practical limit on systems employing Viterbi decoders to decode convolutional codes was about 3 to 6 dB from the Shannon limit. The introduction of turbo codes allowed the design of practical decoders capable of achieving a performance about 0.7 dB from the Shannon limit, surpassing the performance of Viterbi decoders of similar complexity. Therefore, turbo codes offered significant advantage over prior code techniques. Consequently, turbo codes are extensively used in modern data communication standards, such as 3G, 4G, and IEEE 802.16.

FIG. 2 shows a simplified block diagram of the iterative algorithm for decoding turbo codes. The received code block is divided into 3 parts: $(y_0, y_1, y_2)$. Vectors $(y_0, y_1)$ are sent to a first MAP decoder 210, which produces a vector $L^1_{ex}$. The vector $L^1_{ex}$ is sent to an interleaver 220, which performs some mixing of vector components to yield a vector $L^2_{in}$. The vector $L^2_{in}$ and vectors $(y_0, y_2)$ are sent ($u_0$ via an interleaver 240 in the case of $y_0$) to a second MAP decoder 230, which produces a vector $L^2_{ex}$. The vector $L^2_{ex}$ is sent to a deinterleaver 250, which performs a transformation that is an inverse to the transformation performed by the interleaver 220 to yield a vector $L^1_{in}$. The vector L1in and vectors $(y_0, y_1)$ are sent back to the first MAP decoder 210 to begin another iteration. The iterative process stops after a fixed number of iterations or if one or more stopping criteria are met, yielding a result as shown.

While details of the above-described iterative decoding algorithm are out of scope of this discussion, some general observations about the algorithm may be made:

The code blocks may have different lengths. For example, according to 3GPP standards the source message length may vary from 40 to 6144 bits. The channel decoder should efficiently handle a data flow that consists of code blocks of different lengths.

The total time needed to decode a code block is proportional to the code block length.

The total size of memory employed by the channel decoder is proportional to the maximum length of the code block that the channel decoder is able to decode.

Modern high speed data communication systems are designed to support data rates about 100 Mbs and above. To support turbo decoding at this speed, conventional channel decoders use several constituent decoding units working in parallel. Therefore, the channel decoder has to distribute the decoding tasks among its constituent decoding units. A channel decoder containing multiple decoding units works as follows:

1. The decoder receives several code blocks.
2. The decoder makes an assignment of the code blocks into the decoding units.
3. The decoding units perform the decoding tasks in parallel.
4. The decoder retrieves the decoding results.
5. This process is repeated for further code blocks.

SUMMARY

One aspect of the invention provides a system for assigning code blocks to constituent decoding units in a turbo decoding system having parallel decoding units. In one embodiment, the system includes: (1) a resource model generator configured to generate a model that represents the constituent decoding units and memories thereof along two dimensions, (2) a decoding unit number calculator associated with the resource model generator and configured to determine, for each of the code blocks, a number of the constituent decoding units to use to decode subblocks of each of the code blocks, (3) a rectangle mapper associated with the decoding unit number calculator and configured to generate a mapping in which the code blocks are mapped to the model and (4) a code block assigner associated with the rectangle mapper and configured to assign the subblocks of each code block to the constituent decoding units in accordance with the mapping.

Another aspect of the invention provides a method of assigning code blocks to constituent decoding units in a turbo decoding system having parallel decoding units. In one embodiment, the method includes: (1) representing the turbo decoding system as a resource diagram rectangle, (2) representing the code blocks as code block rectangles, (3) mapping the code block rectangles into the resource diagram rectangle and (4) assigning the code blocks to the constituent decoding units based on the mapping.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

Figure 1:
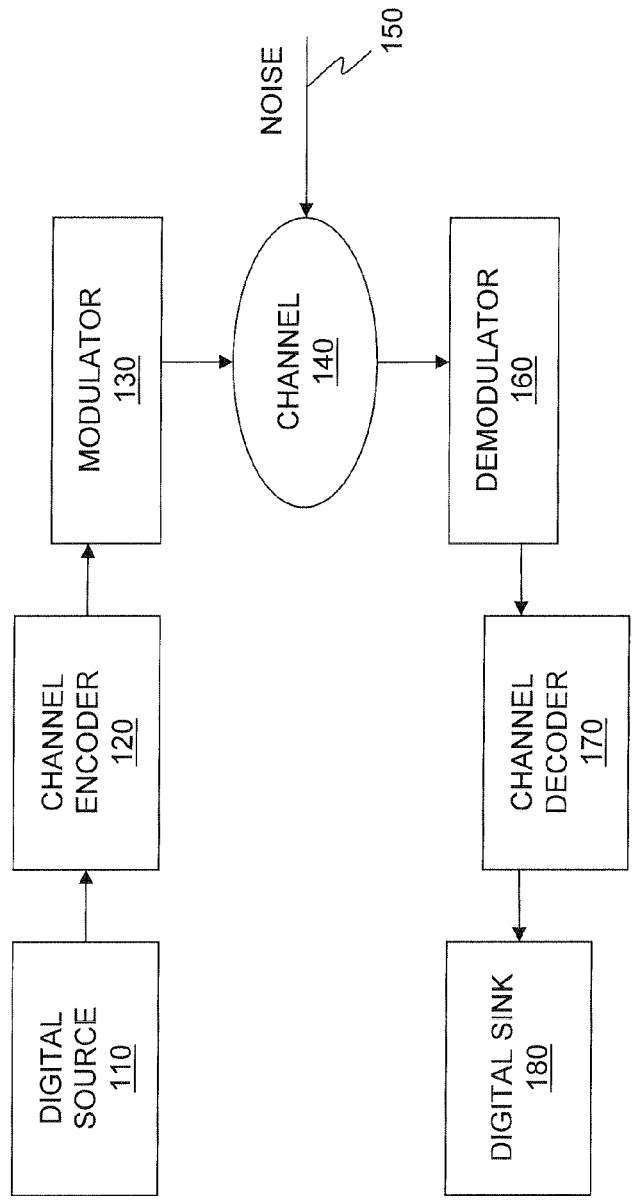
FIG. 1 is a block diagram of a digital communication system that forms an environment within which various embodiments of a system or method for assigning code blocks to constituent decoding units in a turbo decoding system having parallel decoding units constructed or carried out according to the principles of the invention can operate.
Figure 2:
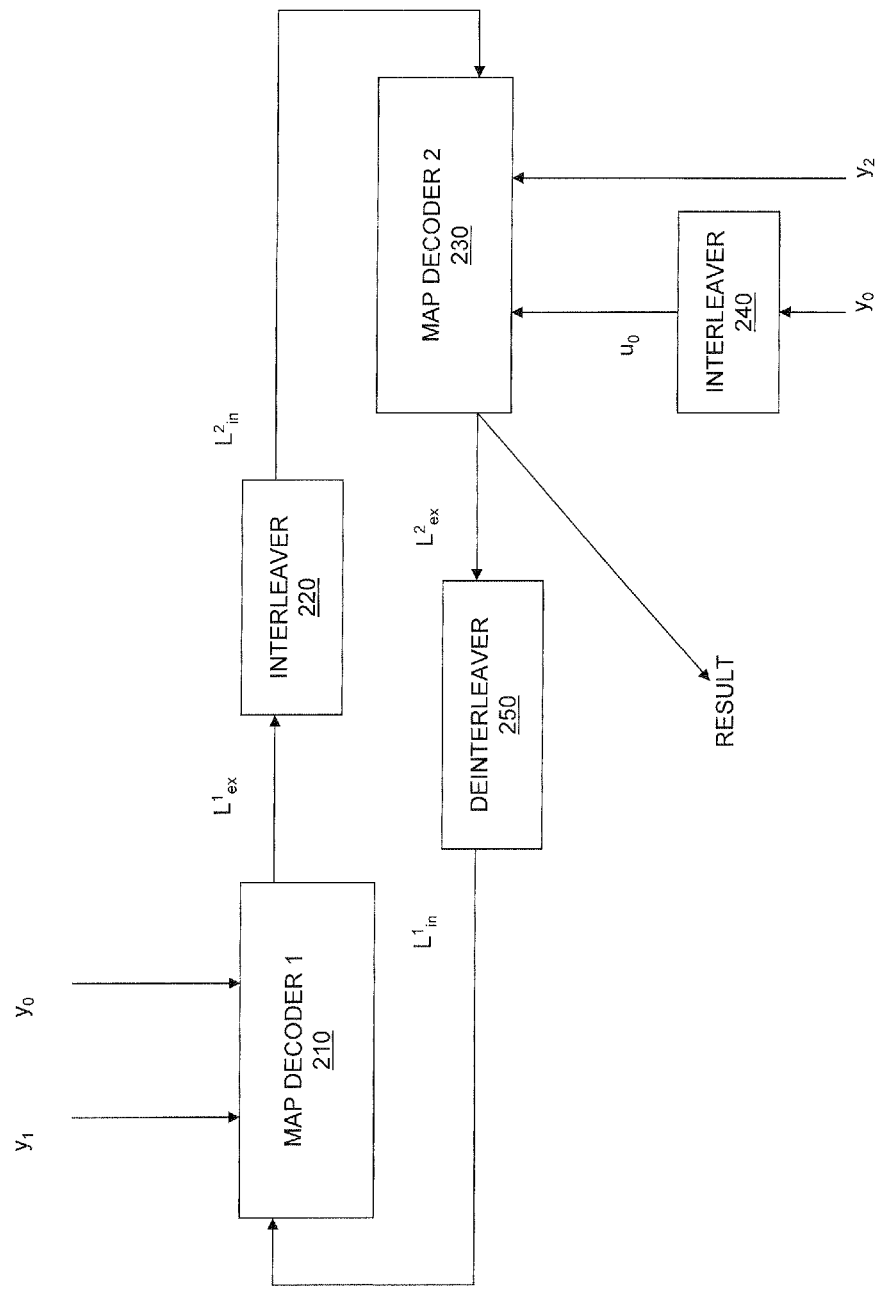
FIG. 2 is a schematic diagram illustrating an iterative turbo decoding algorithm with which various embodiments of a system and method for assigning code blocks may operate.

Described herein is a novel method of assigning code blocks to memories of constituent iterative decoders in a turbo decoding system containing multiple constituent decoding units. The method turns the assignment of code blocks into a rectangle placement task. A novel, corresponding rectangle placement method is also described. Various embodiments of the system or the method may operate within an environment of a digital communication system such as FIG. 1 shows. Various embodiments of the system and method may operate with an iterative turbo-decoding algorithm such as FIG. 2 shows. FIGS. 1 and 2 have been described above and will not be described again here.

Figure 3:
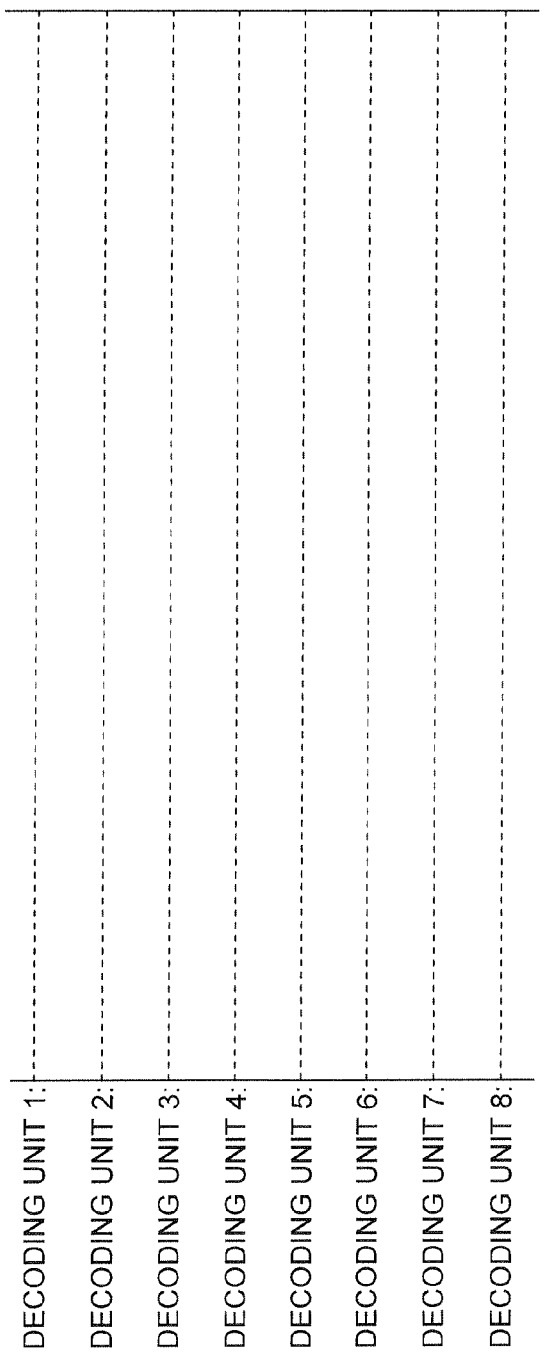
FIG. 3 is an example of a resource diagram that may be employed to represent assignments of code blocks to constituent decoding units in a turbo decoding system having parallel decoding units.

FIG. 3 is an example of a resource diagram that may be employed to represent assignments of code blocks to constituent decoding units in a turbo decoding system having parallel decoding units. The resources of a turbo decoding system with multiple decoding units may be represented in a Cartesian diagram in which segments on the Y axis correspond to decoding units inside the decoding system, and the X axis represents the memory size inside the decoding units or, in other words, the maximum code block length that the decoding units can handle. The turbo decoding system having parallel decoding units represented in the example resource diagram of FIG. 3 has eight decoding units, numbered 1 through 8. The decoding units are assumed to be of equivalent speed and memory capacity, though this need not be the case. The decoding units work in parallel. At the same time MAP-decoders inside the decoding units process points with the same X coordinates.

Figure 4:
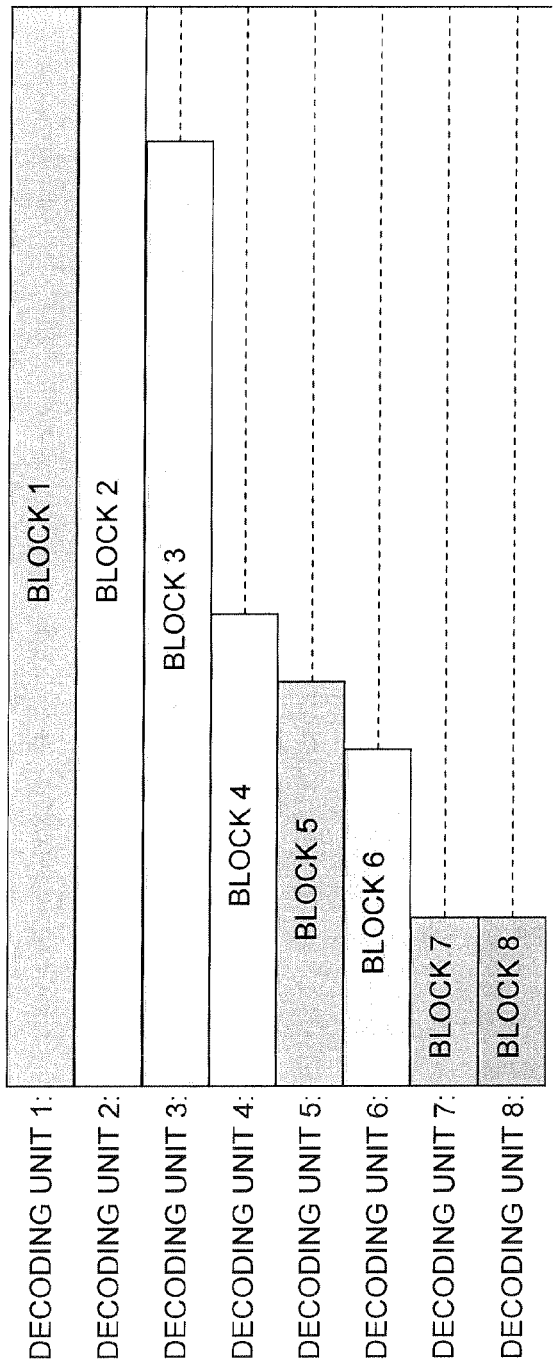
FIG. 4 is an example of a resource diagram representing a trivial code block assignment carried out on a one-decoding-unit-per-code-block basis.

FIG. 4 is an example of a resource diagram representing a trivial code block assignment carried out on a one-decoding-unit-per-code-block basis. Perhaps the simplest way to distribute the decoding tasks between the decoding units is to assign exactly one code block per one decoding unit. In FIG. 4, code blocks 1 through 8 are assigned to decoding units 1 through 8 respectively. Though the code block assignment of FIG. 4 is relatively simple, it has at least two important disadvantages:

a) Every decoding unit should have sufficient memory to accommodate the largest possible code block (e.g., 6144 bits). If the actual code blocks are mostly short (e.g., 40 bits), this memory is used inefficiently.

b) Long code blocks take a relatively long time to decode. Certain decoding units may finish their decoding long before other decoding units finish their decoding.

To address these disadvantages, longer code blocks may be divided into smaller subblocks, and shorter code blocks may be concatenated to form longer code blocks. This approach increases the decoding unit utilization, but under some circumstances may still result in an inefficient utilization. One such circumstance occurs when the length of a particular code block is slightly more than the maximum block length that a decoding unit can accommodate. In this case, almost half of the memory of the decoding unit is wasted.

Concatenating all the code blocks, dividing the resulting concatenated block into N equal parts and assigning one part per one decoding unit would seem to provide a suitable solution. Unfortunately this does not work well at all, because interleaving becomes complicated given this rudimentary assignment.

Figure 5:
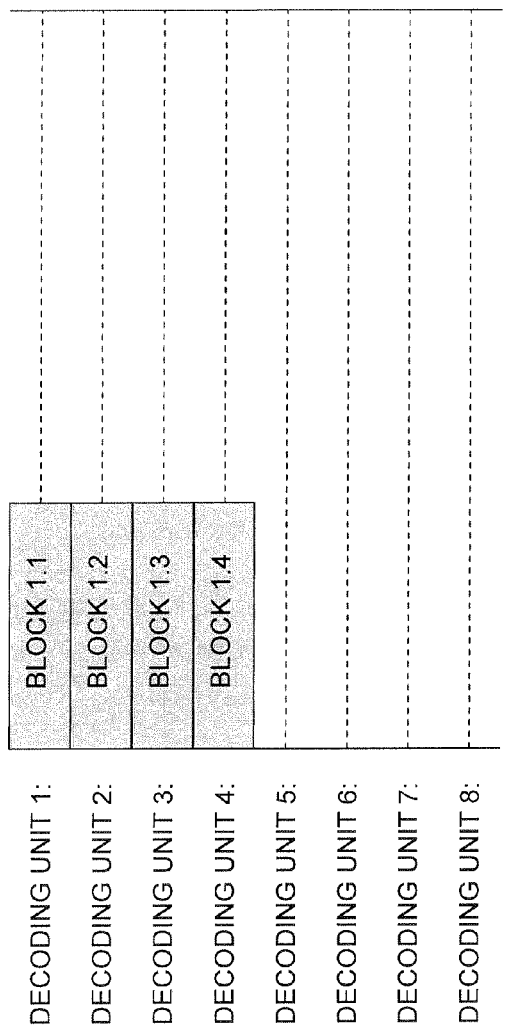
FIG. 5 is an example of a resource diagram representing a rectangle assignment of a single code block.

To address the above-described disadvantages fully, it has been realized that code block assignments may be regarded as a rectangle mapping task, the idea being to map rectangles and then assign code blocks to decoding units based on that mapping. According to one embodiment of a novel assignment method based on the idea, every code block is divided into several subblocks of substantially equal length, the number of subblocks depending on the code block length. "Substantially" is used in the sentence above to indicate that if the code block length is not evenly divisible by the desired number of subblocks, the subblock lengths may differ slightly, e.g., by one bit. The subblocks are then assigned to and decoded in different, typically, adjacent decoding units in such a way that the decoding process in all of the adjacent decoding units starts and ends at substantially the same time. In this case, interleaving can be performed relatively easily. FIG. 5 is an example of a resource diagram representing a rectangle assignment of a single code block that has been divided into four subblocks: subblock 1.1, subblock 1.2, subblock 1.3 and subblock 1.4 and assigned to decoding units 1 through 4, respectively. In the resource diagram of FIG. 5, the subblocks 1.1 through 1.4 are mapped as a rectangle.

One example of a method of generating rectangles of subblocks will now be described. For purposes of the description, it will be assumed that the number of decoding units, N, in the turbo decoding system is a power of two: $N=2^n$. n positive numbers are selected: $0<A_0<A_1<\ldots<A_{n-1}$. These numbers are used to calculate the number of decoding units M that may be used to decode a given code block (which, in geometric terms constitutes the rectangle height M on the resource diagram). The given code block has a length K. In the illustrated embodiment, the following algorithm is used:

if $(K<A_0)$ then $M:=1$ else if (K<$A_1$) then M:=2
else if (K<$A_2$) then M:=4
...
else if (K<$A_{n-1}$) then M:=$2^{n-1}$
else M:=$2^n$ With this method, M is always a power of two: M=$2^m$. The resulting rectangle has a height M and a length of K/M (plus any insubstantial additional length resulting from any remainder resulting from K/M). The area of the rectangle is simply K.

When a code block is represented as a rectangle on a resource diagram, the task of assigning code blocks to constituent decoding units turns into a task of mapping smaller rectangles into a larger rectangle. Various conventional methods exist to solve the rectangle mapping task. One such method will now be described.

The following method may be used to place code block rectangles into the resource diagram rectangle:

1. Create a list of the rectangles sorted by area (K) in descending order.

2. Select the least filled decoding unit on the resource diagram. If more than one is least-filled, select the decoding unit having the lowest number.

3. Map the largest unmapped rectangle in the resource diagram by placing it in the resource diagram such that its upper left corner occupies the first unoccupied position in the selected decoding unit. This guarantees that the code block rectangle will be placed without overlapping.

4. Repeat steps 2 and 3 for each of the unmapped rectangles in the list until all rectangles are mapped.

Figure 6:
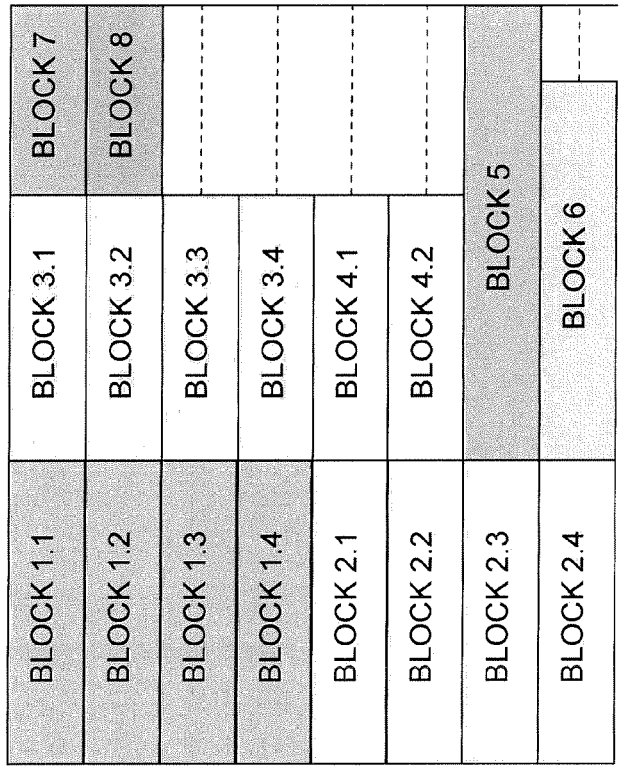
FIG. 6 is an example of a resource diagram representing a rectangle assignment of multiple code blocks.

FIG. 6 is an example of a resource diagram representing a rectangle assignment of multiple code blocks according to the method just described. Having mapped all of the rectangles, it is straightforward to assign code blocks to constituent decoding units given the rectangle mapping. In the example of FIG. 6, subblocks 1.1, 3.1 and 7 are assigned to decoding unit 1; subblocks 1.2, 3.2 and 8 are assigned to decoding unit 2; subblocks 1.3 and 3.3 are assigned to decoding unit 3; subblocks 1.4 and 3.4 are assigned to decoding unit 4; subblocks 2.1 and 4.1 are assigned to decoding unit 5; subblocks 2.2 and 4.2 are assigned to decoding unit 6; subblocks 2.3 and 5 are assigned to decoding unit 7; and subblocks 2.4 and 6 are assigned to decoding unit 8.

Figure 7:
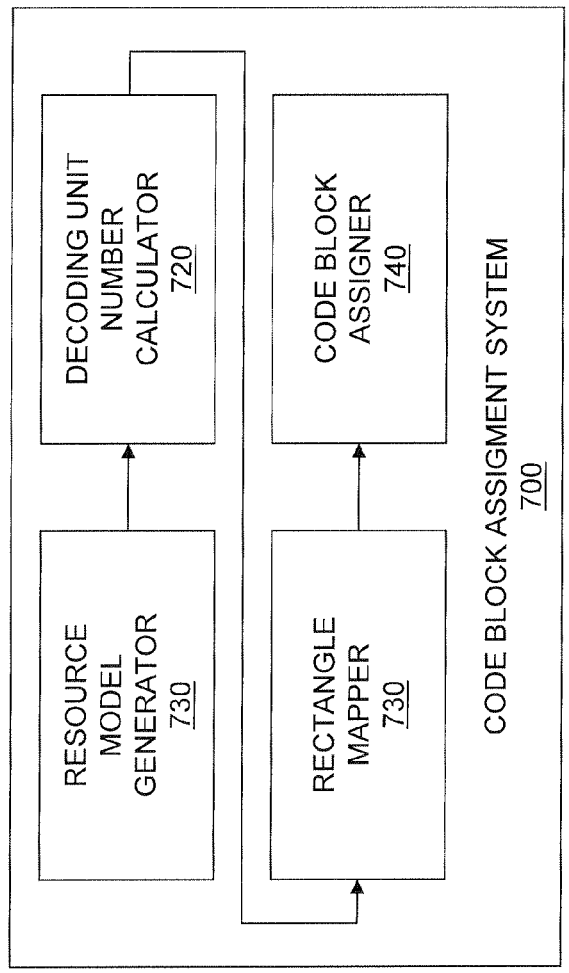
FIG. 7 is a block diagram of one embodiment of a system for assigning code blocks to constituent decoding units in a turbo decoding system having parallel decoding units constructed according to the principles of the invention.

FIG. 7 is a block diagram of one embodiment of a system 700 for assigning code blocks to constituent decoding units in a turbo decoding system having parallel decoding units constructed according to the principles of the invention. The system 700 includes a resource model generator 710. The resource model generator 710 is configured to generate a model of the turbo decoding system that represents its constituent decoding units and memories along two dimensions. If that model is drawn out in graphical form, the rectangular resource diagram of FIG. 3 results. The system 700 further includes a decoding unit number calculator 720. The decoding unit number calculator 720 is configured to determine, for each of a set of code blocks, how many decoding units may or should be used to decode subblocks of each code block. This yields a rectangle for each of the set of code blocks. The system 700 further includes a rectangle mapper 730. The rectangle mapper 730 is configured to map each of the set of code blocks to the model (i.e., the rectangular resource diagram). The system 700 further includes a code block assigner 740. The code block assigner 740 is configured to assign subblocks of each code block to the decoding units in accordance with the mapping that the rectangle mapper 730 produced.

Figure 8:
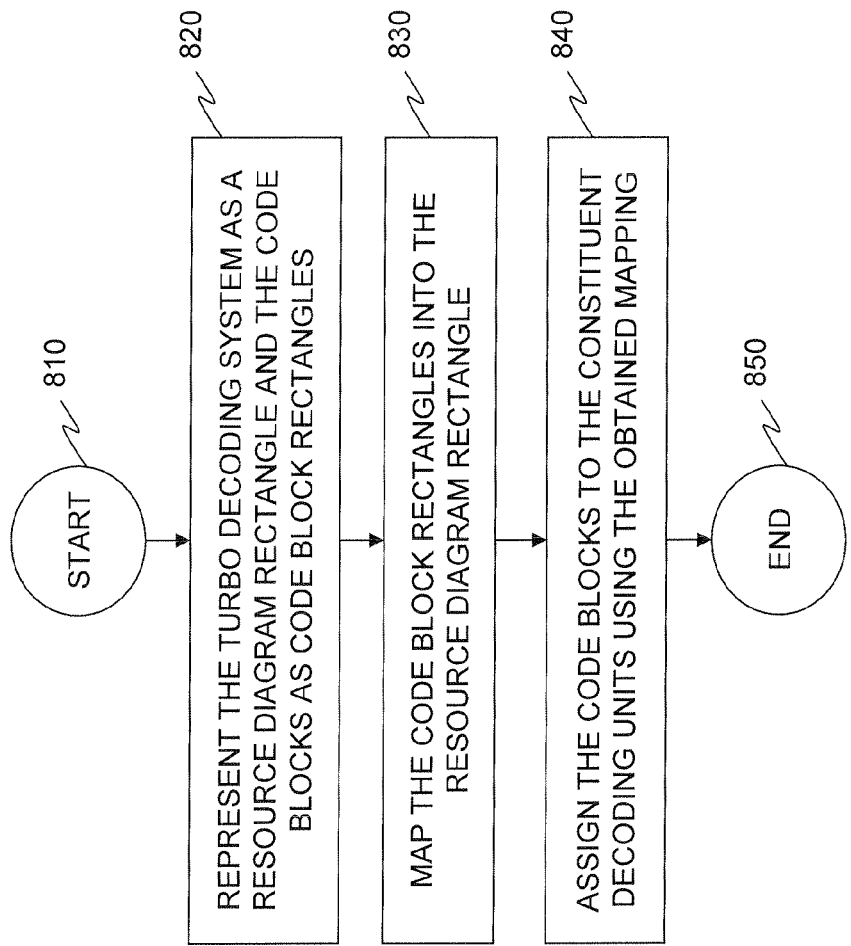
FIG. 8 is a flow diagram of one embodiment of a method of assigning code blocks to constituent decoding units in a turbo decoding system having parallel decoding units carried out according to the principles of the invention.

FIG. 8 is a flow diagram of one embodiment of a method of assigning code blocks to constituent decoding units in a turbo decoding system having parallel decoding units carried out according to the principles of the invention. The method starts in a start step 810. In a step 820, the turbo decoding system is represented as a resource diagram rectangle, and every code block is represented as a code block rectangle, e.g., as described above. In a step 830, the code block rectangles are mapped into a resource diagram rectangle, e.g., as described above. In a step 840, the code blocks are assigned to the constituent decoding units of the turbo decoding system using the obtained mapping. The method ends in an end step 850.

Those skilled in the art to which the invention relates will appreciate that other and further additions, deletions, substitutions and modifications may be made to the described embodiments without departing from the scope of the invention.

What is claimed is:

1. A system for assigning code blocks to constituent decoding units in a turbo decoding system having parallel decoding units, comprising:
    a resource model generator configured to generate a model that represents said constituent decoding units and memories thereof along two dimensions;
    a decoding unit number calculator associated with said resource model generator and configured to determine, for each of said code blocks, a number of said constituent decoding units to use to decode subblocks of each of said code blocks;
    a rectangle mapper associated with said decoding unit number calculator and configured to generate a mapping in which said code blocks are mapped to said model; and
    a code block assigner associated with said rectangle mapper and configured to assign said subblocks of each code block to said constituent decoding units in accordance with said mapping.

2. The system as recited in claim 1 wherein a number of said constituent decoding units is a power of two.

3. The system as recited in claim 1 wherein said number of said constituent decoding units to use to decode said subblocks is a power of two.

4. The system as recited in claim 1 wherein said subblocks of each of said code blocks are of substantially equal length.

5. The system as recited in claim 1 wherein said memories are of equal size.

6. The system as recited in claim 1 wherein said code blocks range in length from 40 bits to 6144 bits.

7. The system as recited in claim 1 wherein said turbo decoding system has at least four of said constituent decoding units.

8. The system as recited in claim 1 wherein at least one of said code blocks is contained in only one subblock.

9. The system as recited in claim 1 wherein said rectangle mapper is configured to generate said mapping in an order that is based on lengths of said code blocks.

10. The system as recited in claim 1 wherein said code blocks are divided into different numbers of subblocks.

* * * * *